(12) United States Patent
Avouris et al.

(10) Patent No.: US 6,843,850 B2
(45) Date of Patent: Jan. 18, 2005

(54) CATALYST-FREE GROWTH OF SINGLE-WALL CARBON NANOTUBES

(75) Inventors: Phaedon Avouris, Yorktown Heights, NY (US); Vincent Derycke, Ossining, NY (US); Richard Martel, Peekskill, NY (US); Marko Radosavljevic, Peasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/226,733

(22) Filed: Aug. 23, 2002

(65) Prior Publication Data

US 2004/0035355 A1 Feb. 26, 2004

(51) Int. Cl.$^7$ .............................................. C30B 25/02
(52) U.S. Cl. .............................. 117/40; 117/84; 117/92
(58) Field of Search .............................. 117/84, 92, 40, 117/41, 53, 932

(56) References Cited

U.S. PATENT DOCUMENTS 6,250,984 B1 * 6/2001 Jin et al. ...................... 445/51
6,630,722 B1 * 10/2003 Aoki .......................... 257/435

OTHER PUBLICATIONS

M. Kusunoki et al., *A Formation Mechanism of Carbon Nanotube Films on SiC(0001)*, Applied Physics Letters, vol. 77, No. 4, Jul. 24, 2000, pp. 531–533.

* cited by examiner

*Primary Examiner*—Felisa Hitesherw
(74) *Attorney, Agent, or Firm*—F. Chau & Associates, LLC

(57) ABSTRACT

A method for growing single-walled nanotubes comprises providing a silicon carbide semiconductor wafer comprising a silicon face and a carbon face, and annealing the silicon carbide semiconductor wafer in a vacuum at a temperature of at least about 1300 degrees Celsius, inducing formation of single wall carbon nanotubes on the silicon face.

19 Claims, 4 Drawing Sheets

AFM MANIPULATION

AFM MANIPULATION

ANNEALING AT 1300°C

CATALYST-FREE GROWTH OF SINGLE-WALL CARBON NANOTUBES

BACKGROUND OF THE INVENTION

1. Field of the Invention

The present invention relates to semiconductor devices, and more particularly to a method for growing single-wall carbon nanotubes in the absence of a catalyst.

2. Discussion of the Related Art

In the field of molecular nanoelectronics, few materials show as much promise as nanotubes, and in particular carbon nanotubes, which comprise hollow cylinders of graphite, angstroms in diameter. Nanotubes can be implemented in electronic devices such as diodes and transistors, depending on the nanotube's electrical characteristics. Nanotubes are unique for their size, shape, and physical properties. Structurally a carbon-nanotube resembles a hexagonal lattice of carbon rolled into a cylinder.

Besides exhibiting intriguing quantum behaviors at low temperature, carbon nanotubes exhibit at least two important. characteristics: a nanotube can be either metallic or semiconductor depending on its chirality (i.e., conformatioral geometry). Metallic nanotubes can carry extremely large current densities with constant resistivity. Semiconducting nanotubes can be electrically switched on and off as field-effect transistors (FETs). The two types may be covalently joined (sharing electrons). These characteristics point to nanotubes as excellent materials for making nanometer-sized semiconductor circuits.

Nanotubes can be formed as a single-wall carbon nanotube (SWNT) or a multi-wall carbon nanotube (MWNT). SWNTs can be produced by, for example, arc-discharge and laser ablation of a carbon target. Local growth of tubes on a surface can also be obtained by chemical vapor deposition (CVD). The growth of the nanotubes is made possible by the presence of metallic particles, such as Co, Fe and/or Ni, acting as catalyst. The resultant carbon nanotubes comprise contaminants, e.g., catalyst particles. For most potential nanotubes applications the use of clean nanotubes can be important, for example, where nanotubes are implemented as an active part of electric devices. The presence of contaminating atoms and particles can alter the electrical properties of the nanotubes. The metallic particles can be removed, however the process of cleaning or purifying the nanotubes can be complicated and can alter the quality of the nanotubes.

Silicon carbide (SiC) has been identified as a substrate for catalyst-free growth of multi-walled carbon nanotubes (MWNTs). SiC is a semiconductor that can crystallize under hexagonal or cubic forms. In the direction of the growth ([0001] for hexagonal SiC and [001] for cubic SiC), it is composed of alternate layers of silicon and carbon. SiC wafers of up to 4" are commercially available. Because the layers are grouped by pairs, the two opposite faces of a wafer are different. One face is naturally composed of silicon atoms, the other face of carbon. These two faces are thus called the Si-face and the C-face.

Catalyst-free growth of MWNTs can be achieved by annealing the C-face of hexagonal silicon carbide in vacuum. However, the resulting MWNTs grow perpendicular to the surface. Based on cross-sectional transmission electron microscopy (TEM) experiments, Kunsunoki et al. (A Formation Mechanism of Carbon Nanotube films on SiC(0001), Appl. Phys. Lett. 77, 531 (200)) concluded that annealing the Si-face of SiC does not produce nanotubes but rather a graphite-like surface.

SWNTs have been identified as a potential component of electronic devices. The quality of nanotubes, e.g., their ability to act as a semiconductor, can be affected by contaminants. Therefore, a need exists for a method of catalyst-free growth of single-wall carbon nanotubes.

SUMMARY OF THE INVENTION

A method for growing single-walled nanotubes comprises providing a silicon carbide semiconductor water, and annealing the silicon face of the silicon carbide semiconductor wafer in a vacuum at a temperature of at least about 1300 degrees Celsius, inducing formation of single-walled nanotubes.

No catalyst need be used in inducing the formation of the single-walled nanotubes. The vacuum may be about a pressure of less than $10^{-9}$ Torr. The temperature may be about 1650 degrees Celsius.

In a preferred embodiment the method further comprises bonding the single-walled nanotubes to a target wafer. Bonding can be promoted by one of thermal annealing, chemical reaction and physical adhesion of the nanotubes to the target wafer.

The method can further comprise suspending the single-walled nanotubes in a solution, and dispersing the single-walled nanotubes on a target wafer. Dispersing may comprise one of random dispersion and self-assembly. Self-assembly comprises attaching a coupler to each end of at least one nanotube and providing a corresponding receptor on the target wafer for receiving the coupler.

A plurality of single-walled nanotubes can form a network. The network is arranged according to a structure and a symmetry of the silicon carbide semiconductor.

A method for growing single-walled nanotubes comprises providing a substrate comprising carbon and annealing the substrate in a vacuum at a temperature of at least about 1350 degrees Celsius, inducing formation of single-walled nanotubes.

The method further comprises patterning the substrate to form patches. The method influences the chirality of a grown nanotube according to a direction of patterning. The patterning is by one of lithography and focused electron beam patterning.

The substrate is one of a silicon carbide wafer, substrate of silicon carbide micro crystals, and graphite.

A method for growing a network of ordered single-walled nanotubes comprises providing a silicon carbide semiconductor wafer. The method further comprises annealing the silicon carbide semiconductor wafer in a vacuum at a temperature of at least about 1350 degrees Celsius, inducing formation of a network of single-walled nanotubes arranged according to a symmetry of the silicon carbide semiconductor.

BRIEF DESCRIPTION OF THE FIGURES

Preferred embodiments of the present invention will be described below in more de-ail, with reference to the accompanying drawings.

DETAILED DESCRIPTION OF PREFERRED EMBODIMENTS

The present invention comprises a method for growing single-walled nanotubes (SWNTs) in the absence of a catalyst.

Figure 1:
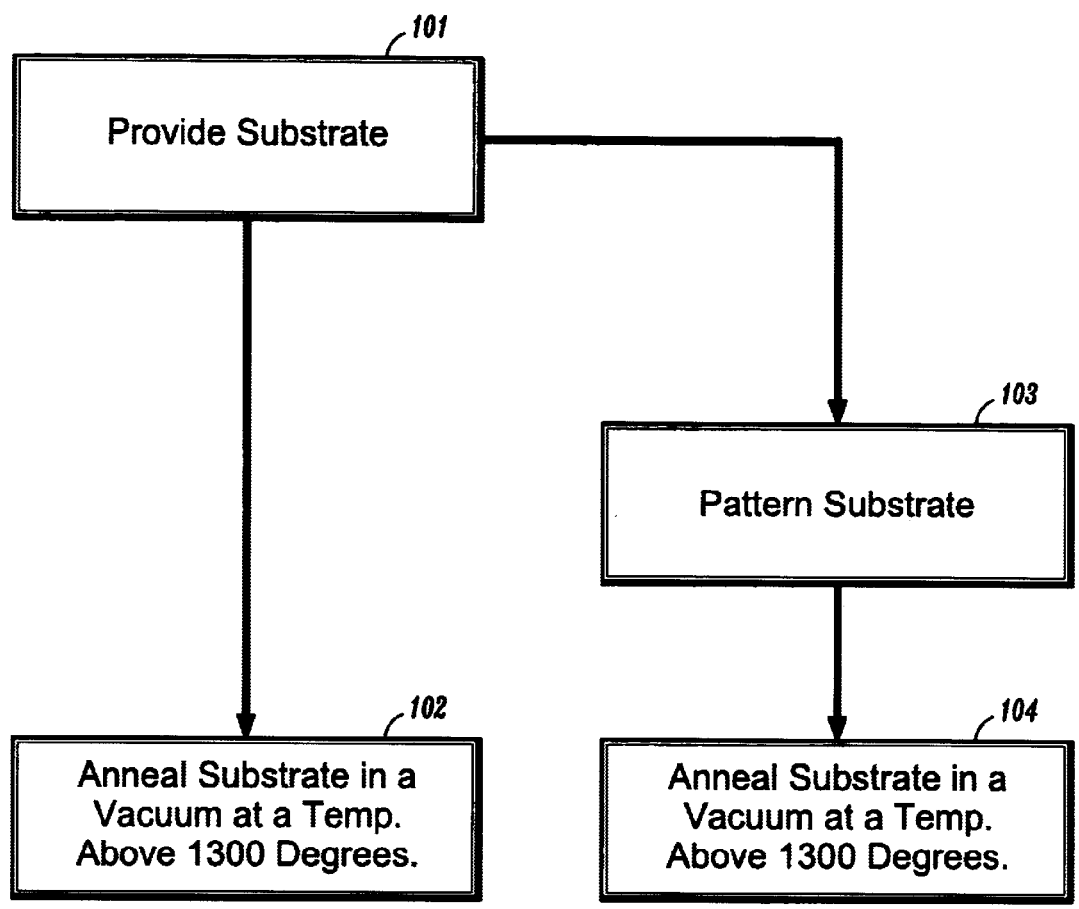
FIG. 1 is a flow chart of a method according to an embodiment of the present invention.

Referring to FIG. 1, a substrate such as a silicon carbide (SiC) semiconductor wafer or a wafer of SiC micro crystals is provided 101. The substrate is annealed in a vacuum and/or in a substantially inert environment, e.g. an inert gas, at a predetermined temperature 102. The inert gas can be, for example, Argon, Neon or Helium.

According to an embodiment of the present invention, annealing a SiC wafer, having a silicon face and a carbon face, can induce the roll-up of graphite pieces into SWNTs on the Si-face of a SiC wafer. The annealing can be performed in a vacuum, preferably being an ultra-high vacuum (UHV) (e.g., $P<10^{-9}$ Torr). This transformation is achieved in a sufficiently high temperature. It is observed that a temperature of at least about 1350C is sufficient. The nanotubes that are formed are predominately SWNTs. The SWNTs can be very long and have a good crystalline quality.

Figure 2A:
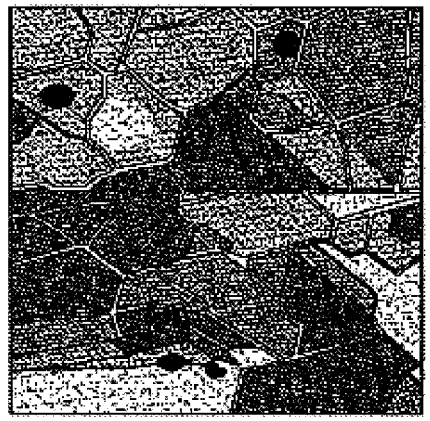
FIGS. 2*a*–*b* show STM images of a first semiconductor wafer according to an embodiment of the present invention.
Figure 2C:
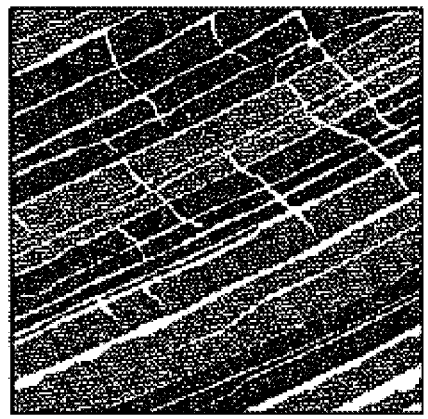
FIGS. 2*c*–*d* show STM images of a second semiconductor wafer according to an embodiment of the present invention.
Figure 2B:
Figure 2D:
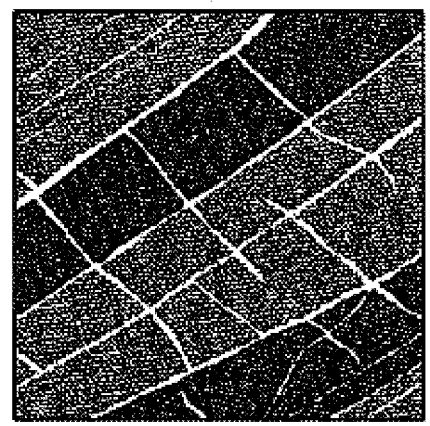

FIGS. 2a–b and 2c–d show STM images of two samples, referred to hereinafter as Y and T respectively, after annealing in vacuum at 1650° C. for 15 minutes. Sample T was cut along the (1,-1,0,0) axis of the wafer and its morphology can be characterized by well-ordered parallel steps in the (1,1,-2,0) direction. Sample Y was cut 30° off the (1,-1,0,0) axis in a different region of the wafer. Its morphology shows no organized step network but larger terraces of hexagonal orientation. The white structures are SWNTs. The SWNTs extend over several steps or terraces of the SiC wafer and are not present on the samples annealed in vacuum at temperatures below 1400° C. (as confirmed by STM and SEM experiments not shown). It is clear from FIG. 2, that the nanotubes are not randomly distributed but rather conform to the morphology of the semiconductor surface. Studies of the two types of samples show that this organization is uniform over the entire area. When the surface morphology comprises terraces (e.g., sample Y, FIGS. 2a and 2b), the nanotubes form a web-like network with a predominance of 120° angles between straight sections. The arrow in FIG. 2b marks a typical symmetric Y-structure For semiconductors having a surface comprising parallel steps (e.g., sample T shown in FIGS. 2c and 2d), the nanotubes can align either along, or perpendicular to, the step edges. In this case, the tendency to form 90° angles is shown in FIG. 2d.

Figure 3A:
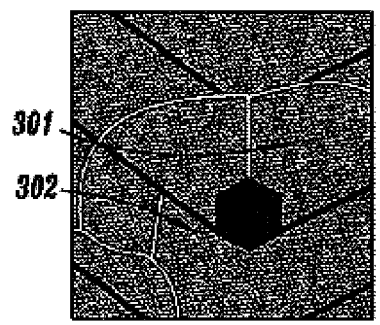
FIGS. 3a–b show non-contact atomic force microscope image of a first sample comprising nanotubes before and after manipulation, respectively, according to an embodiment of the present invention.
Figure 3B:
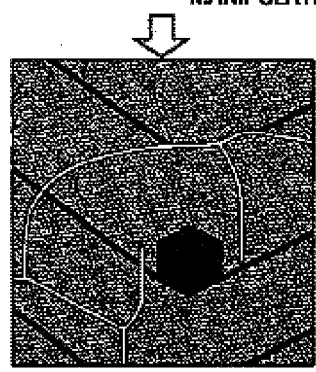

FIGS. 3a and 3b show the same area of a SiC surface before and after atomic force microscope (AFM) manipulations. The AFM can be used to obtain an image of the nanotube by scanning the AFM tip above the surface of the semiconductor wafer. The AFM tip can be brought down to the surface and used to physically move nanotubes. The two manipulations marked by arrows in FIG. 3a show that it is possible to move the position of Y structures (301 and 302) along the biggest branch which is consistent with the unraveling of a bundle.

Figure 3C:
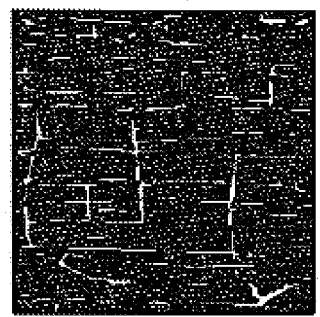
FIGS. 3c–d show non-contact atomic force microscope image of a second sample comprising nanotubes before and after manipulation, respectively, according to an embodiment of the present invention.
Figure 3D:

According to an embodiment of the present invention, ordered networks of SWNTs can be formed. The SWNTs are grown in a random manner and then moved to an ordered position. By annealing a sample in vacuum at a temperature too low to grow new nanotubes, the nanotubes can be organized. FIGS. 3c and 3d illustrate a manipulation of the nanotubes by AFM to perturb their alignment. After manipulation, the sample is re-annealed in a vacuum at a temperature too low to grow new nanotubes. FIG. 3d shows the same area as in FIG. 3c after several manipulations. As shown in FIG. 3d some sections of nanotubes that were straight are now bent, some sections have been divided into several branches and new sections have appeared. The arrow on FIG. 3d marks a new section of nanotube that did not appear in FIG. 3c. It is clear that this section connects two preexisting sections. Note that no manipulation has been made at the exact position of the new segment but one of the two previously visible segments has been manipulated. This behavior is highly reproducible and all the new sections are connected to older ones. This strongly supports the idea that only part of the grown nanotubes is visible on the surface. The growth of the nanotubes takes place in several atomic layers and the network of nanotubes is composed of nanotubes from different depths connected together. It follows that AFM manipulation can bring sub-layer segments of nanotubes to the surface, wherein the carbon can pass through the silicon at sufficiently high temperatures. The fact that the new segments are aligned in the same direction as the surface ones suggests that the nanotubes are also ordered below the surface.

The Si-surface of 6H-SiC annealed at high temperature, e.g., greater than about 1350 degrees Celsius, can be considered to be composed of several layers of graphite. It can be difficult to imagine a nanotube being extracted from the sample to the surface through a well-ordered grapheme sheet. The surface is more probably composed of several pieces of graphite layers.

Figure 3E:
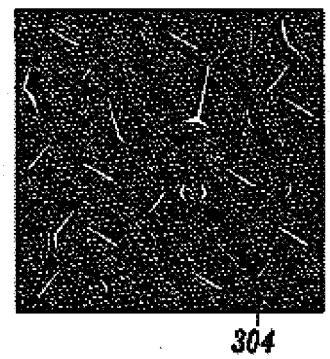
FIGS. 3e–f show non-contact atomic force microscope image of the second sample comprising nanotubes before and after re-annealing, respectively, according to an embodiment of the present invention.
Figure 3F:
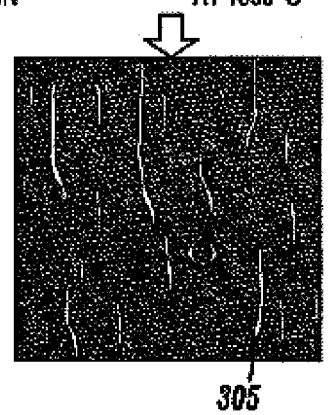

After several areas have been manipulated and segments of nanotubes have been either bent or moved to the surface, the sample can be re-annealed in a vacuum at 1300° C. for two (2) hours. FIGS. 3e and 3f show the same area of the surface before and after this annealing step. It is clear from FIG. 3f that the nanotubes have moved back to a well-ordered configuration. This demonstrates that the ordering of the nanotubes is due to a diffusion process that follows the growth. This diffusion releases part of the mechanical stress incorporated in the randomly grown network by favoring straight segments and by matching the crystallographic order of the surface. At the same time, formation of bundles contributes to the lowering of the total energy.

The catalyst-free growth of single-walled nanotubes on silicon carbide takes place in several steps. Silicon is evaporated from the SiC surface leading to a more and more carbon-rich surface. Above 1350° C., the amorphous carbon on the surface starts to crystallize into pieces (or patches) of grapheme. These pieces of graphite contain dangling bonds, particularly at their edges. Nanotubes can be formed when the dangling bonds of the graphite pieces bond together.

In the absence of catalyst particles, the presence of graphic patches can be sufficient to initiate the growth of nanotubes at high temperature. Referring to FIG. 1, for the catalyst-free formation of nanotubes, a graphite sample can be used as a substrate 101. A sample of Highly orientated Pyrolytical Graphite (HOPG) can be patterned to into patches 103. Methods for inducing the format-on of grapheme patches include, for example, lithography, focused electron beam patterning techniques. The sample can be annealed in vacuum to induce the bonding and rolling of these patches into nanotubes 104.

Nanotubes of a given chirality can be produced by tuning the direction of the patch edges. The direction of nanotube growth is in the direction of an edge of the patch. Patterning the substrate graphitic patches can favor the growth of tubes with a given chirality.

The carbon nanotubes produced are located at the surface of the SiC wafer. Therefore, the nanotubes can be transferred onto another substrate, such as an insulting or a patterned surface, by a simple bonding process or other methods involving a dispersion of he nanotubes in a solution.

Direct bonding comprises bonding the SiC wafer with the nanotubes at the surface to the target wafer using processes that are either promoted by thermal annealing or chemical reaction or physical adhesion between the target surface and the carbon nanotubes. It has the advantage of keeping the structure of the network of tubes formed as in FIG. 2.

The solution-based technique comprises making a suspension of the tubes into a solution and disperse them back onto a target wafer using either random dispersion or self-assembly processes. The solution can be made from divers solvents (e.g., water, ethanol, dischloroethane, etc.) with the possible addition of surfactants or polymers that help to stabilize the nanotubes and avoid the formation of bundles of tubes.

Figure 4A:
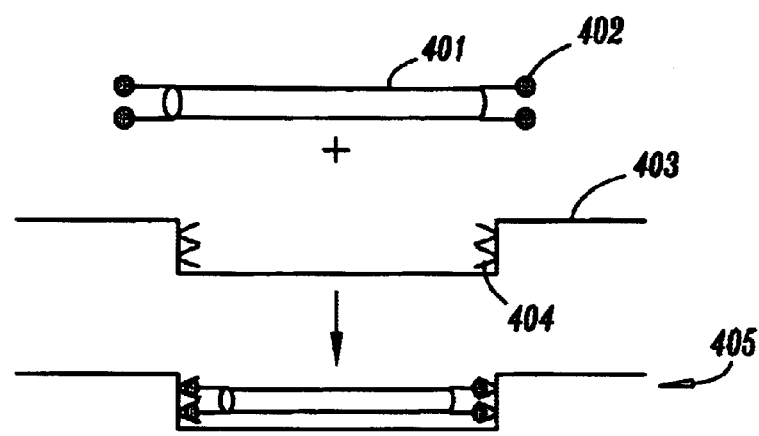
FIGS. 4a and 4b illustrate directed assembly of nanotubes according to an embodiment of the present invention.
Figure 4B:
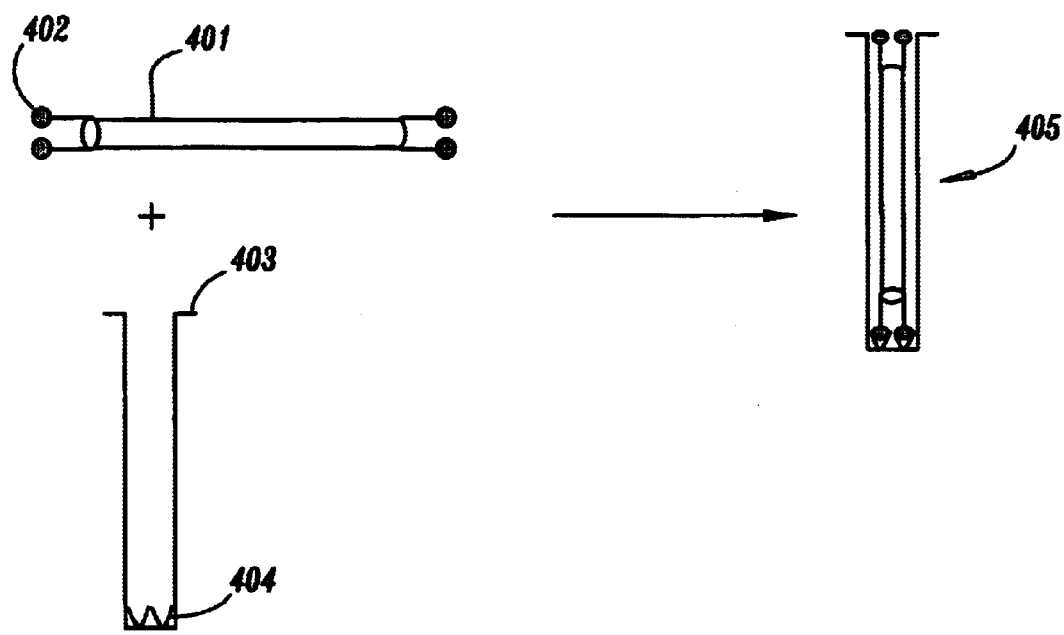

According to an embodiment of the present invention, nanotubes can be put in place by a method of self- or directed assembly rather than deposited as described above. Directed assembly can be used for horizontal and vertical deposition of a nanotube using selective deposition driven by a chemical or a physical process. The selective deposition can include forming an adhesion layer or chemical groups acting as receptors to favor a desired deposition of tubes in a given position. FIGS. 4a and 4b show methods for horizontal and vertical directed assembly, respectively. A nanotube 401 can be prepared comprising predetermined chemical groups 402, for example, a DNA strand or a thiol group, at each end or located on the side walls. The nanotube 401 can be brought into the proximity of a substrate 403 comprising receptors 404, for example, where DNA is implemented, a complementary DNA strand can be used. Where a thiol group is used, gold particles or a contact shape comprising gold, can be designed to bond with the chemical groups 402 of the nanotube 401. The nanotube 401 can thus be placed on the substrate 403 according to directed assembly.

Having described preferred embodiments of a method of catalyst-free growth of single-wall carbon nanotubes, it is noted that modifications and variations can be made by persons skilled in the art in light of the above teachings. It is therefore to be understood that changes may be made in the particular embodiments of the invention disclosed which are within the scope and spirit of the invention as defined by the appended claims: Having thus described the invention with the details and particularity required by the patent laws, what is claimed and desired protected by Letters Patent is set forth in the appended claims.

What is claimed is:

1. A single-walled nanotube that has been manufactured in the absence of a catalyst.

2. The single-walled nanotube according to claim 1 having been annealed substantially inert atmosphere at a temperature of at least about 1350 degrees Celsius.

3. A method for growing single-walled nanotubes comprising the steps of:
   providing a silicon carbide wafer; and
   annealing the silicon carbide semiconductor wafer in a substantially inert atmosphere at a temperature of at least about 1350 degrees Celsius, inducing formation of said single-walled nanotubes.

4. The method of claim 3, wherein annealing is carried out without use of a catalyst.

5. The method of claim 3, wherein the substantially inert atmosphere has about a pressure of less than $10^{-9}$ Torr.

6. The method of claim 3, wherein the annealing step is carried out at a temperature of at least about 1650 degrees Celsius.

7. The method of claim 3, further comprising bonding the single-walled nanotubes to a target wafer.

8. The method of claim 7, wherein the step of bonding is promoted by one of thermal annealing, chemical reaction and physical adhesion of the single-walled nanotubes to the target wafer.

9. The method of claim 3, further comprising:
   suspending the single-walled nanotubes in a solution; and
   dispersing the single-walled nanotubes on a target wafer.

10. The method of claim 9, wherein the step of dispersing comprises one of random dispersion and self-assembly.

11. The method of claim 10, wherein the self-assembly comprises:
   attaching a coupler to each end of at least one single-walled nanotube; and
   providing a corresponding receptor on the target wafer for receiving the coupler.

12. The method of claim 3, further comprising arranging a plurality of said single-walled nanotubes to a network.

13. The method of claim 12, wherein the network is arranged according to a structure and a symmetry of the silicon carbide wafer.

14. A method for growing single-walled nanotubes comprising:
   providing a substrate comprising carbon; and
   annealing the substrate in a substantially inert atmosphere at a temperature of at least about 1350 degrees Celsius, inducing formation of said single-walled carbon nanotubes.

15. The method of claim 14, further comprising patterning the substrate to form patches.

16. The method of claim 15, further comprising influencing the chirality of a said nanotube according to a direction of patterning.

17. The method of claim 15 wherein the patterning is made by one of lithography and focused electron beam patterning.

18. The method of claim 14, wherein the substrate is selected from the group comprising silicon carbide wafer, substrate of silicon carbide micro crystals, and graphite.

19. A method for growing a network of ordered single-walled nanotubes comprising the steps of:
   providing a silicon carbide wafer and
   annealing the silicon carbide semiconductor wafer in a vacuum at a temperature of at least about 1350 degrees Celsius, inducing formation of said network of single-walled nanotubes arranged according to a symmetry and a structure of the silicon carbide wafer.

* * * * *